(12) United States Patent
Sohn (10) Patent No.: US 9,000,966 B2
(45) Date of Patent: Apr. 7, 2015

(54) INTEGRATED CIRCUIT, ANALOG-DIGITAL CONVERTER AND CMOS IMAGE SENSOR WITH THE SAME

(71) Applicant: SK Hynix Inc., Gyeonggi-do (KR)

(72) Inventor: Young-Chul Sohn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/049,994

(22) Filed: Oct. 9, 2013

(65) Prior Publication Data

US 2014/0346320 A1 Nov. 27, 2014

(30) Foreign Application Priority Data

May 24, 2013 (KR) .................. 10-2013-0059098

(51) Int. Cl.
*H03M 1/12* (2006.01)
*H04N 5/378* (2011.01)
*H03M 1/00* (2006.01)

(52) U.S. Cl.
CPC .............. *H04N 5/378* (2013.01); *H03M 1/002* (2013.01); *H03M 1/12* (2013.01)

(58) Field of Classification Search
CPC ..... H03M 1/56; H03M 1/765; H03M 1/0868; H03M 3/454
USPC .......................................... 341/144, 155, 135
See application file for complete search history.

(56) References Cited

U.S. PATENT DOCUMENTS

| 4,387,399 | A | * | 6/1983 | Novotny ...................... 348/730 |
| 5,440,258 | A | * | 8/1995 | Galbi et al. .................. 327/112 |
| 7,496,458 | B2 | * | 2/2009 | Walter et al. ................... 702/57 |
| 8,030,992 | B2 | * | 10/2011 | Lu et al. ...................... 327/554 |
| 8,040,269 | B2 | * | 10/2011 | Bogaerts ...................... 341/169 |
| 8,253,405 | B2 | * | 8/2012 | Trivedi et al. ................ 323/283 |
| 8,373,497 | B2 | * | 2/2013 | Petruzzi ....................... 327/534 |
| 2013/0257280 | A1 | * | 10/2013 | Myers et al. .................. 315/122 |

FOREIGN PATENT DOCUMENTS

KR 1020120029019 3/2012

\* cited by examiner

*Primary Examiner* — Peguy Jean Pierre
(74) *Attorney, Agent, or Firm* — IP & T Group LLP (57) ABSTRACT

A integrated circuit includes an analog power domain circuit having more than one stages, a digital power domain circuit having at least one stage receiving the output signal of the analog power domain circuit, and a voltage regulating unit suitable for supplying at least one scaled power to the latter part of the stages to reduce a voltage level difference between the analog power domain circuit and the digital power domain circuit.

19 Claims, 9 Drawing Sheets

INTEGRATED CIRCUIT, ANALOG-DIGITAL CONVERTER AND CMOS IMAGE SENSOR WITH THE SAME

CROSS-REFERENCE TO RELATED APPLICATIONS

The present application claims priority of Korean Patent Application No. 10-2013-0059098, filed on May 24, 2013, which is incorporated herein by reference in its entirety.

BACKGROUND

1. Field

Exemplary embodiments of the present invention relate to an integrated circuit design, and more particularly, to a complementary metal oxide semiconductor image sensor.

2. Description of the Related Art

A conventional column-parallel CMOS image sensor (hereinafter, referred to as a CMOS image sensor or a CIS) includes a plurality of analog-digital converters (ADCs), a plurality of buffer memories, and a plurality of sense amplifiers. The analog-digital converters convert analog signals that are sensed in a pixel array, where a plurality of pixels are arrayed, into digital signals.

Herein, each of the analog-digital converters includes a voltage generator for generating a reference signal, for example, a ramp signal VRAMP, a comparator for comparing the value of pixel signal transferred from the pixel array with the ramp signal VRAMP, and a counter for counting the output signals of the comparator.

The analog-digital converter uses comparator that is formed in a cascading form to obtain a sufficient gain. Meanwhile, the counter operates by using a voltage that is different from the voltage for the comparator. That is, the counter and the comparator operate at different power domains.

According to the conventional technology, when the power domain is changed from an analog power domain of the comparator to a digital power domain of the counter, offset may occur and the gain may be deteriorated due to the voltage level difference between the two power domains.

The deteriorated gain of the comparator causes the resolution of the comparator to be decreased.

In addition, power noise is caused due to the operation characteristics of an inverter-type amplifier circuit included in the analog-digital converter and may become a concern.

SUMMARY

Various embodiments of the present invention are directed to an integrated circuit for securing margin in an operation region to maximize amplification gain, and an analog-digital converter and a CMOS image sensor with the same.

To be specific, an exemplary embodiment of the present invention is directed to an integrated circuit that alleviates the offset and deterioration in gain due to the voltage level difference between an analog power domain and a digital power domain and distributes and relieves power noise caused by an inverter-type amplifier circuit, and an analog-digital converter and a CMOS image sensor with the same.

In accordance with an embodiment of the present invention, a integrated circuit may include an analog power domain circuit having more than one stages, a digital power domain circuit having at least one stage receiving the output signal of the analog power domain circuit, and a voltage regulating unit suitable for supplying at least one scaled power to the latter part of the stages to reduce a voltage level difference between the analog power domain circuit and the digital power domain circuit.

In accordance with an embodiment of the present invention, an analog-digital converter may include a voltage regulating unit suitable for scaling a voltage for each stage of an analog power domain circuit to produce a scaled voltage and to supply the scaled voltage to the stage of the analog power domain circuit to reduce a voltage level difference between the analog power domain circuit and a digital power domain circuit, a comparison block suitable for operating by using an analog voltage and the scaled voltage obtained in the voltage scaling unit and for comparing a value of a pixel signal with a value of a ramp signal based on a comparator control signal to produce a comparison result, and a counting block suitable for performing a counting operation based on the comparison result of the comparison block by using a digital voltage.

In accordance with an embodiment of the present invention, a CMOS image sensor may include a pixel array suitable for outputting pixel signals corresponding to incident light, a voltage regulating unit suitable for scaling a voltage for each stage of an analog power domain circuit to produce a scaled voltage and for supplying the scaled voltage to the stage of the analog power domain circuit to reduce a voltage level difference between the analog power domain circuit and a digital power domain circuit, a comparison block suitable for operating by using an analog voltage and the scaled voltage obtained in the voltage scaling unit and for comparing values of the pixel signals with a value of a ramp signal based on a comparator control signal to produce a comparison result, a counting block suitable for performing a counting operating based on the comparison result of the comparison block by using a digital voltage, a buffer memory block suitable for operating by using the digital voltage and for storing count information obtained in the counting block, a column controlling block suitable for controlling operations of the counting block and the buffer memory block, and a sense amplifying block suitable for reading data stored in the buffer memory block and for outputting digital pixel data.

In accordance with another embodiment of the present invention, an integrated circuit may include an analog power domain circuit operating by using a analog power, a digital power domain circuit operating by using a digital power, and a scaled-down power domain circuit, which is disposed between the analog power domain circuit and the digital power domain circuit, operating by using at least one scaled-down power. The scaled-down power has a voltage level higher than the voltage level of the digital power and lower than the voltage level of the analog power.

In accordance with another embodiment of the present invention, a CMOS image sensor may include a pixel array suitable for outputting pixel signals corresponding to incident light, a comparison block suitable for comparing voltage levels of the pixel signals with a voltage level of a ramp signal by using a first power, and for outputting a comparison result by using a second power, which has a voltage level that is lower than a voltage level of first power, and a counting block suitable for performing a counting operation based on the comparison results by using a third power, which has a voltage level that is lower than the voltage level of second power.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

Throughout the present specification, when a certain part is described to be 'connected to' another part, it means not only a 'direct connection' but also an 'electrical connection' with another device between the two parts. Also, when a particular part is described to 'include' or 'have' a particular constituent element, it does not exclude the presence of another constituent element but may further include or have another constituent element, unless mentioned otherwise. Also, throughout the present specification, some constituent elements may be described in a singular form but it does not signify that the scope and spirit of the present invention are limited to it and the constituent element may be provided in plural.

Figure 1:
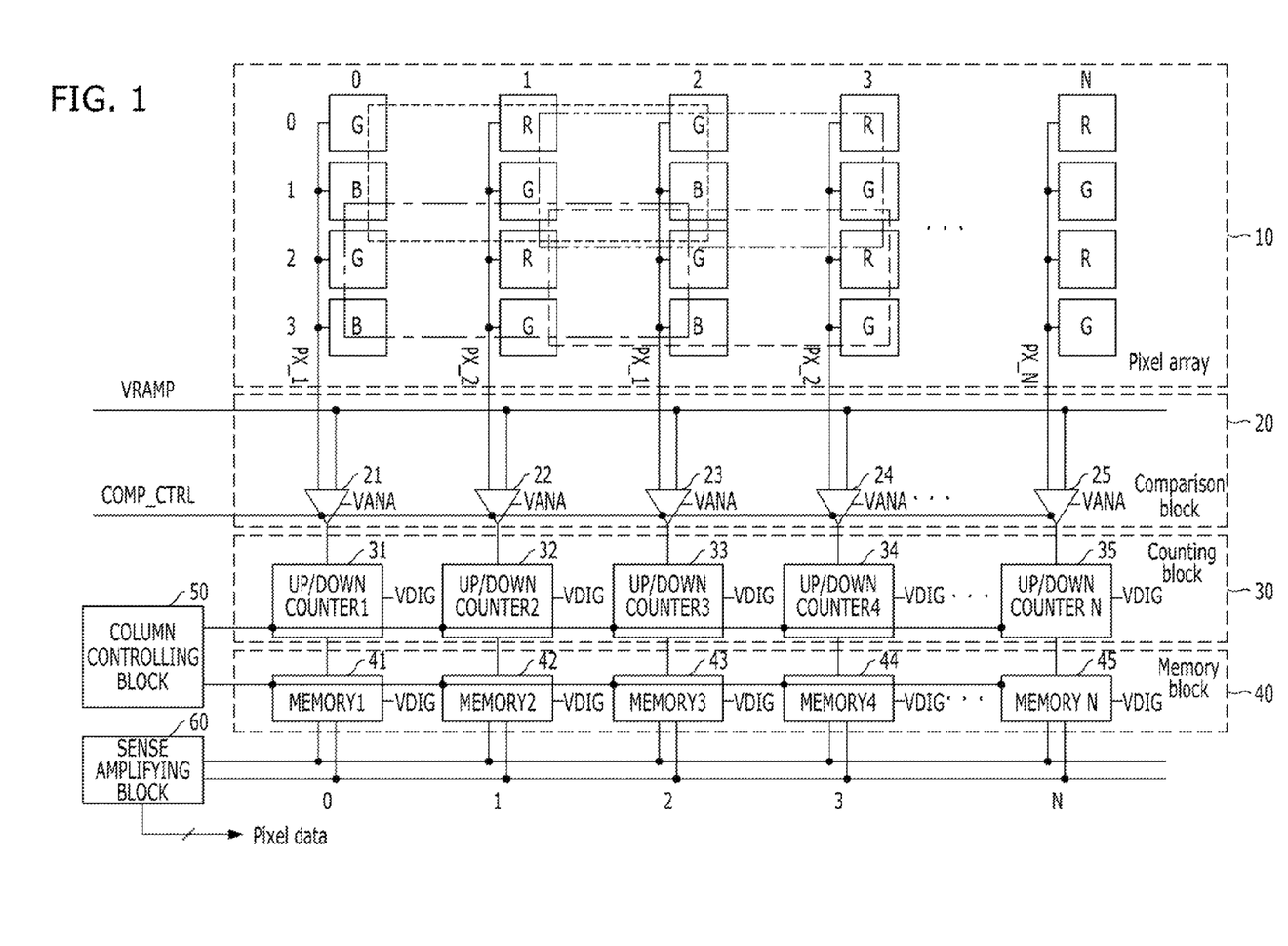
FIG. 1 is a block diagram illustrating a CMOS image sensor with a plurality of analog-digital converters.

FIG. 1 is a block diagram illustrating a CMOS image sensor with a plurality of analog-digital converters.

Referring to FIG. 1, the CMOS image sensor includes a pixel array 10, a comparison block 20, a counting block 30, a buffer memory block 40, a column controlling block 50, and a sense amplifying block 60.

The pixel array 10 outputs pixel signals corresponding to incident light. The comparison block 20 compares the values of the pixel signals outputted from the pixel array 10 with a reference signal, for example, a ramp signal VRAMP, that is transferred from an external voltage generator (not shown) in response to a comparator control signal COMP_CTRL that is transferred from an external CIS controller (not shown). The counting block 30 performs counting operation based on an output of the comparison block 20. The buffer memory block 40 stores count information that is outputted from the counting block 30. The column controlling block 50 controls the operations of the counting block 30 and the buffer memory block 40. The sense amplifying block 60 reads the data stored in the buffer memory block 40 and outputs digital pixel data.

The comparison block 20 includes a plurality of comparators 21 to 25, and the counting block 30 includes a plurality of up/down counters 31 to 35. The buffer memory block 40 includes a plurality of buffer memories 41 to 45. Hereafter, a unit analog-digital converter (ADC) including one comparator and one up down counter is exemplarily described.

A first comparator 21 receives a first pixel signal PX_1, which is outputted from the first column pixel of the pixel array 10, through a terminal on one side, receives a reference signal, for example, a ramp signal VRAMP, which is transferred from the external voltage generator (not shown), through a terminal on another side, and compares the values (or voltage levels) of the two signals with each other in response to a comparator control signal COMP_CTRL that is transferred from the external CIS controller.

Since the ramp signal VRAMP has its voltage level decreasing as time passes, there is a moment when the values of the two signals inputted to the first comparator 21 become the same. At that moment when the two signal's coincide with each other, the value outputted from the first comparator 21 changes.

As a result, a first up/down counter 31 performs counting from a moment when the ramp signal VRAMP falls to a moment when the output of the first comparator 21 changes. The first up/down counter 31 operates based on a clock applied from the column controlling block 50.

A first buffer memory 41 stores a value counted in the first up/down counter 31, which is referred to as count information hereafter, and outputs the count information based on an address applied from the column controlling block 50.

The pixels of the pixel array 10 and the comparators 21 to 25 of the comparison block 20 use a first voltage (or a first power) VANA for an analog power domain, and the up/down counters 31 to 35 of the counting block 30 use a second voltage (or a second power) VDIG for a digital power domain, of which a level is different from a level of the first voltage VANA. For example, the level of the second voltage VDIG may be lower than the level of the first voltage VANA. When power domain is changed from the analog power domain to the digital power domain, offset and gain deterioration may occur due to the voltage level difference between the two power domains.

Figure 2A:
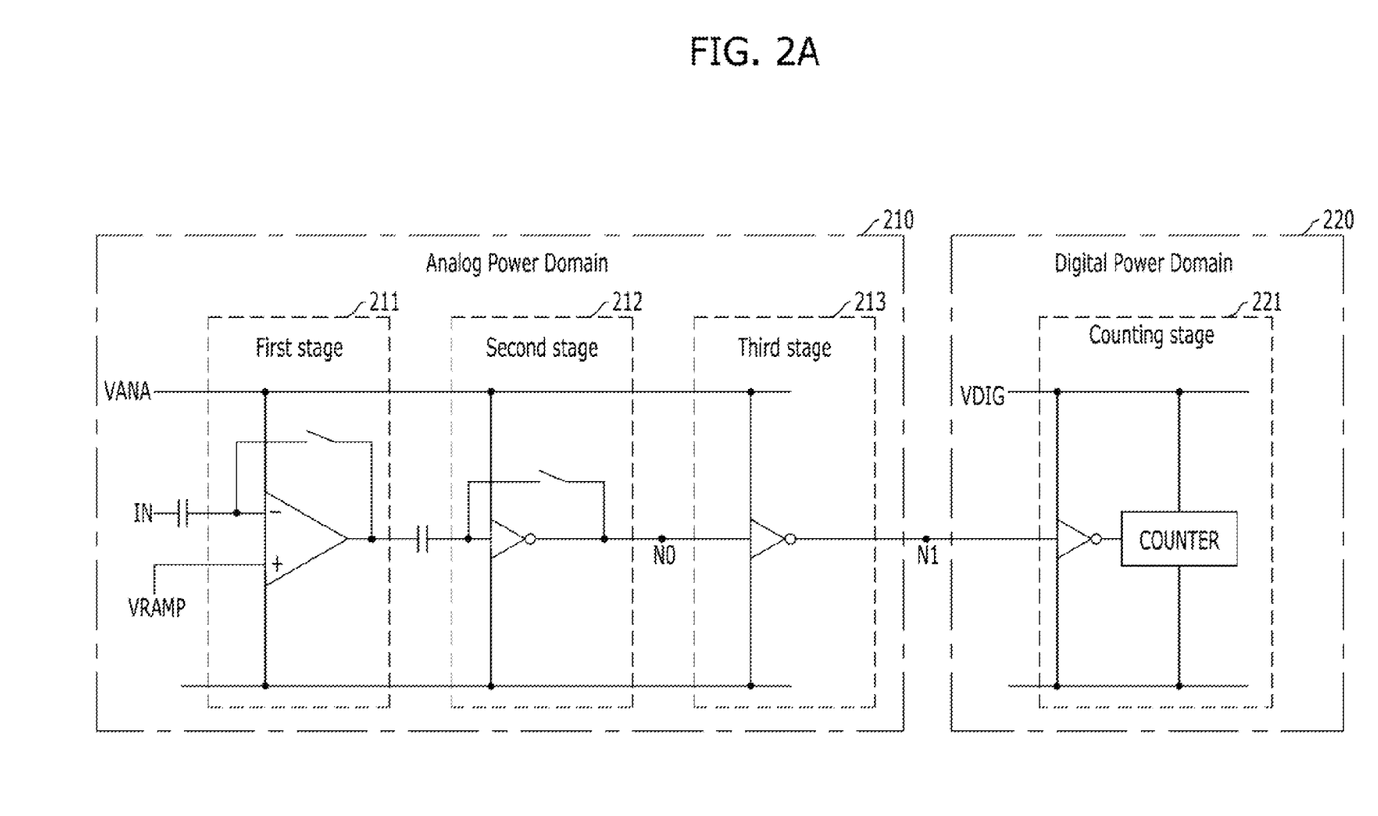
FIGS. 2A and 2B are circuit diagrams illustrating an integrated circuit, including, for example, the unit ADC with one comparator and one up/down counter.
Figure 2B:
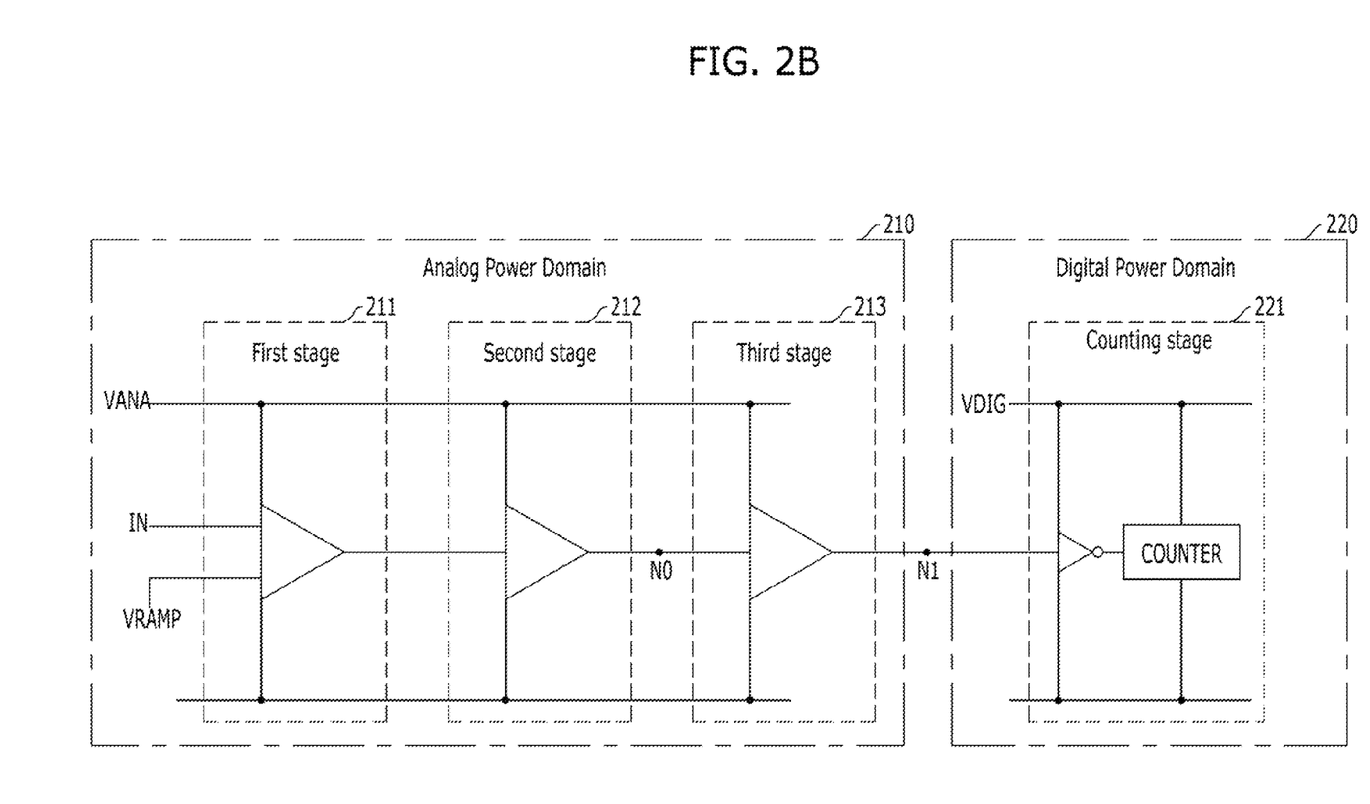
Figure 3:
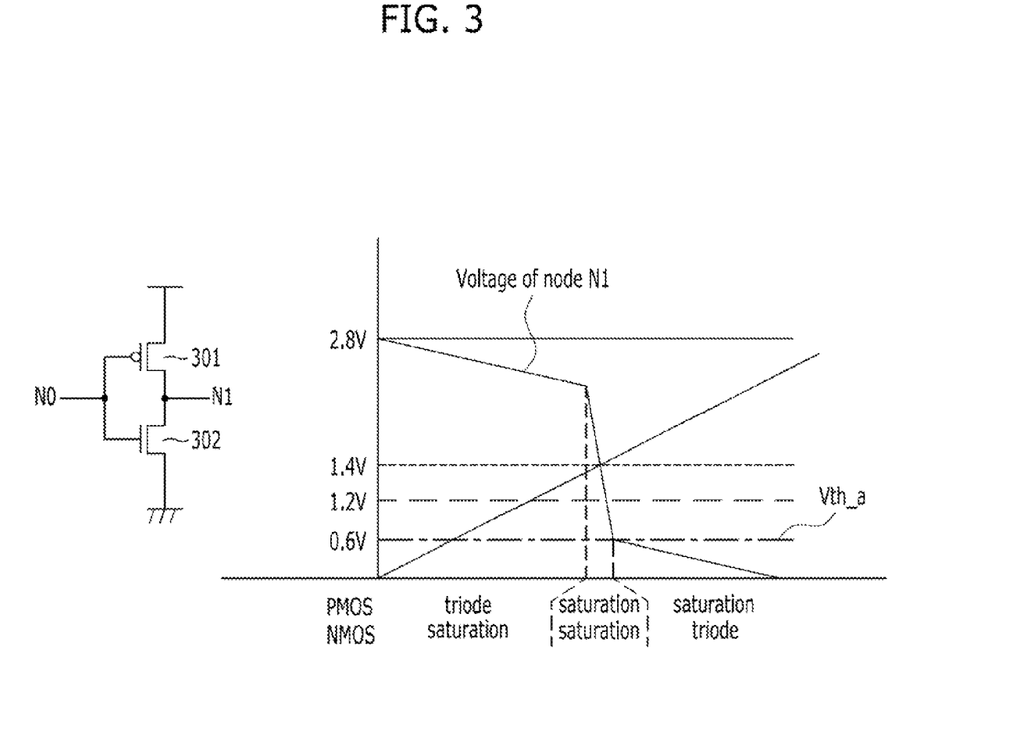
FIG. 3 illustrates a circuit configuration of an inverter-type amplifier stage and its output characteristics curve.

FIGS. 2A and 2B are circuit diagrams illustrating an integrated circuit, including, for example, the unit ADC with one comparator and one up/down counter. FIG. 3 illustrates a circuit configuration of an inverter-type amplifier stage and its output characteristics curve.

Referring to FIGS. 2A and 2B, a comparator is realized in an analog power domain 210 to compare a pixel signal IN with the ramp signal VRAMP, which are analog outputs, and a up/down counter is realized in a digital power domain 220 to perform counting in a digital value. Also, since a sufficient gain has to be obtained to realize a target resolution of an analog-digital converter (ADC), an amplification stage of the comparator may be realized to have more than two stages. FIGS. 2A and 2B illustrate a case where the comparator is realized to have first to third stages 211 to 213. The comparator may be realized to have not only three stages but also a plurality of stages, such as two, four or five stages.

Referring to FIGS. 2A and 2B for example, when it is assumed that the first voltage VANA of the analog power domain 210 is approximately 2.8V and the second voltage VDIG of the digital power domain 220 is approximately 1.2V, response characteristics at a part where domain is changed, e.g., a first node N1, appear as shown in the graph of FIG. 3. The graph of FIG. 3 shows the output characteristics curve of the third stage 213, which is the same as the output characteristics curve of the first node N1. The third stage 213 may be a typical AB class amplifier, e.g., inverter-type amplifier, in the analog power domain 210 having a voltage level VANA of approximately 2.8V, and the circuit illustrated in FIG. 3 shows a typical example of an inverter-type amplifier.

Herein, the third stage 213 has its output level changed according to the operation statuses of a PMOS transistor 301 and an NMOS transistor 302, and has the output characteristics curve shown in FIG. 3.

When it is assumed that the second voltage VDIG of the digital power domain 220 is approximately 1.2V as described above, a general logic threshold becomes approximately 0.6V, which is similar to a threshold voltage Vth_a of an analog domain transistor. Accordingly, as shown in FIG. 3, the PMOS transistor 301 approaches to a triode region, and the NMOS transistor 302 operates in a saturation region, making the output of the third stage 213 smooth.

Also, as shown in FIG. 3, in a region where the output of the third stage 213 is steep, both the PMOS transistor 301 and the NMOS transistor 302 operate in the saturation region making the gain big. However, in the region around 0.6V the NMOS transistor 302 enters the triode region, making the gain of the third stage 213 drastically drop. The drop in gain deteriorates the resolution of the comparator.

Also, in a particular range of lower than approximately 0.6V, there may be a concern that gain margin is even more decreased due to skew variation of analog transistors TR, 301 and 302 that are used in the third stage 213 and skew variation of a digital transistor TR used in the counting stage 221.

Therefore an embodiment of the present invention discloses a technology for securing gain margin in operation region by scaling a voltage for each stage and maximizing the amplification gain.

In other words, according to an embodiment of the present invention, offset and deterioration in gain occurring from the voltage level difference between the analog power domain and a digital power domain when the analog power domain is changed into the digital power domain may be alleviated by scaling a voltage for each stage. This may maximize the amplification gain and also may distribute and alleviate power noise caused by the use of an inverter-type amplifier. This is described hereafter in detail with reference to FIGS. 4 to 7.

Figure 4:
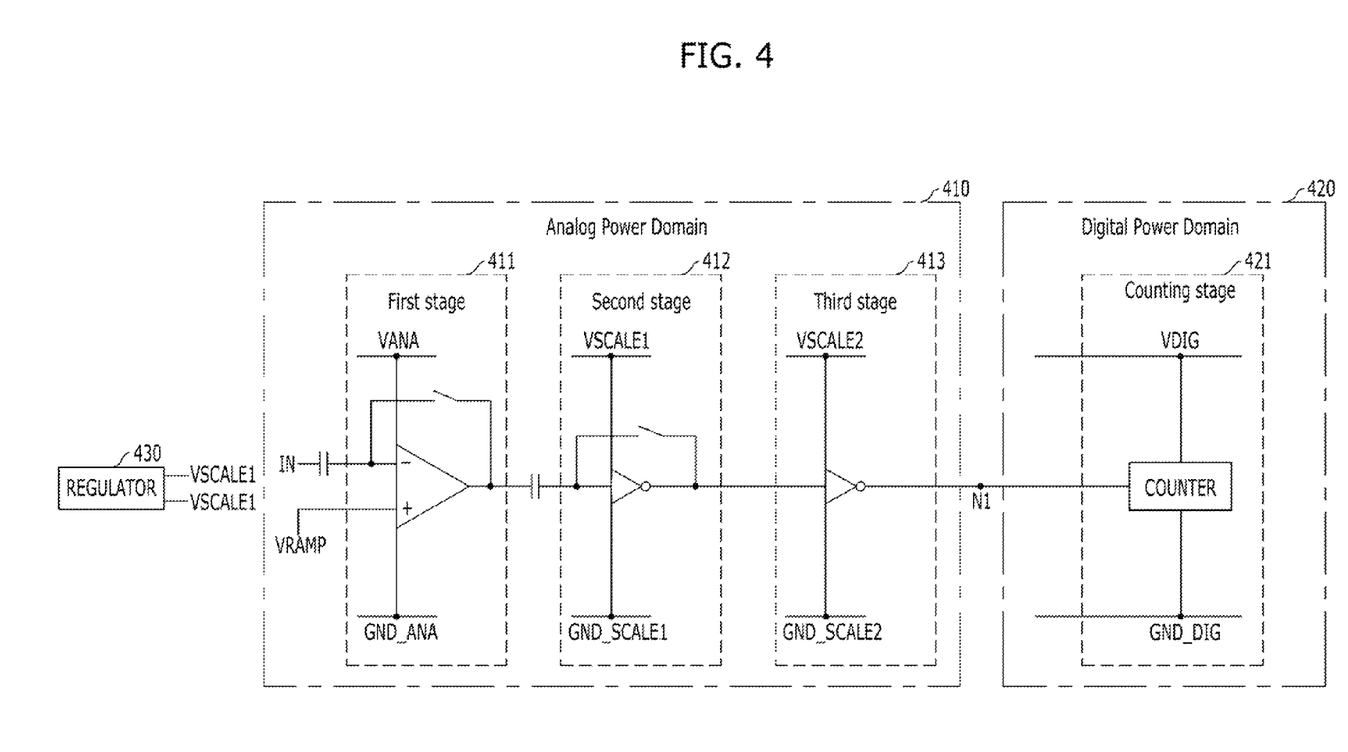
FIG. 4 is a circuit diagram illustrating an integrated circuit in accordance with an embodiment of the present invention.
Figure 5:
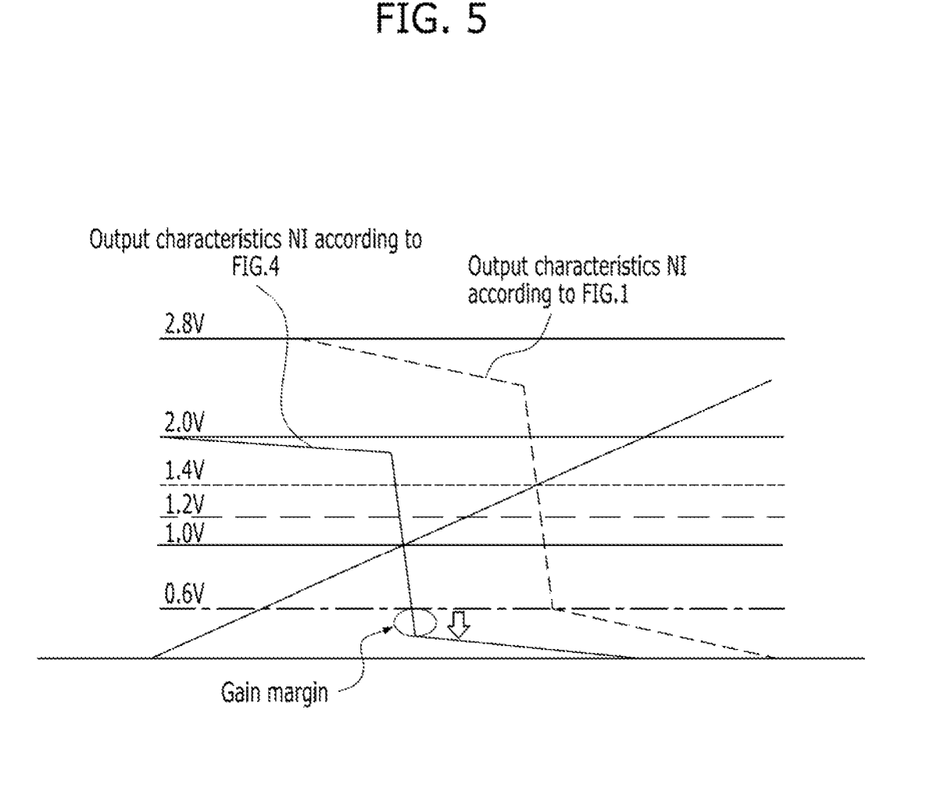
FIG. 5 is a graph illustrating the output characteristics of an inverter-type amplifier stage of the integrated circuit in accordance with the embodiment of the present invention.

FIG. 4 illustrates a circuit configuration of an integrated circuit, including, for example, unit ADC with one comparator and one up/down counter in accordance with an embodiment of the present invention. FIG. 5 is a graph illustrating the output characteristics of an inverter-type amplifier stage shown in FIG. 4.

The ADC in accordance with the embodiment of the present invention may include an analog power domain 410 including more than one stage, a digital power domain 420 including more than one stage, and a regulator 430. The regulator 430 reduces the voltage level difference between the analog power domain 410 and the digital power domain 420 by scaling a voltage for each stage of the analog power domain 410 and supplying a scaled voltage for each stage of the analog power domain 410.

The analog power domain 410 may include a first stage 411 operating by using the first voltage VANA, a second stage 412 operating by using a first scaled voltage VSCALE1, and a third stage 413 operating by using a second scaled voltage VSCALE2. Further, the digital power domain 420 may include a counting stage 421 operating by using the second voltage VDIG. Further, the regulator 430 may reduce the voltage level difference between the analog power domain 410 and the digital power domain 420 by down-scaling the voltage into the first scaled voltage VSCALE1 and the second scaled voltage VSCALE2 and by supplying the scaled voltages to the corresponding second stage 412 and the third stage 413 of the analog power domain 410. Hereinafter, the second and third stages 412 and 413 operating by using the first and second scaled voltages VSCALE1 and VSCALE2 may be referred to as a scaled power domain circuit or a scaled-down power domain circuit.

Herein, the regulator 430 may be a low-dropout (LDO) regulator.

As illustrated in FIG. 4, the basic framework of the integrated circuit, including, for example, the unit ADC, in accordance with the embodiment of the present invention seems similar to what is shown in FIGS. 2A and 2B, but the power domain structures are different.

For example, when it is assumed that the first voltage VANA of the analog power domain 410 is approximately 2.8V and the first scaled voltage VSCALE1 is approximately 2.5V and the second scaled voltage VSCALE2 is approximately 2.0V the output characteristics of the third stage 413 is as illustrated in FIG. 5, and this is the output characteristics of a node N1.

On the contrary, the conventional power domain structure illustrated in FIGS. 2A and 2B uses approximately 2.8V in all of the first to third stages 211 to 213. Since a drain-source voltage (VDS) of the NMOS transistor 302 of FIG. 3 needs to be higher, the NMOS transistor 302 comes to operate in a triode region when an input voltage is relatively higher than a supplied voltage, forming a knee point higher than a logic threshold of the digital power domain, which leads to a decreased gain.

Therefore, when the voltage is scaled, in other words, when the voltage is down-scaled for each stage, the supplied voltage becomes low, allowing a voltage where the NMOS transistor 302 of the third stage 413 operate in the triode region to be obtained more quickly and securing a gain margin at the logic threshold of the second voltage VDIG more firmly (refer to FIG. 5).

Figure 6:
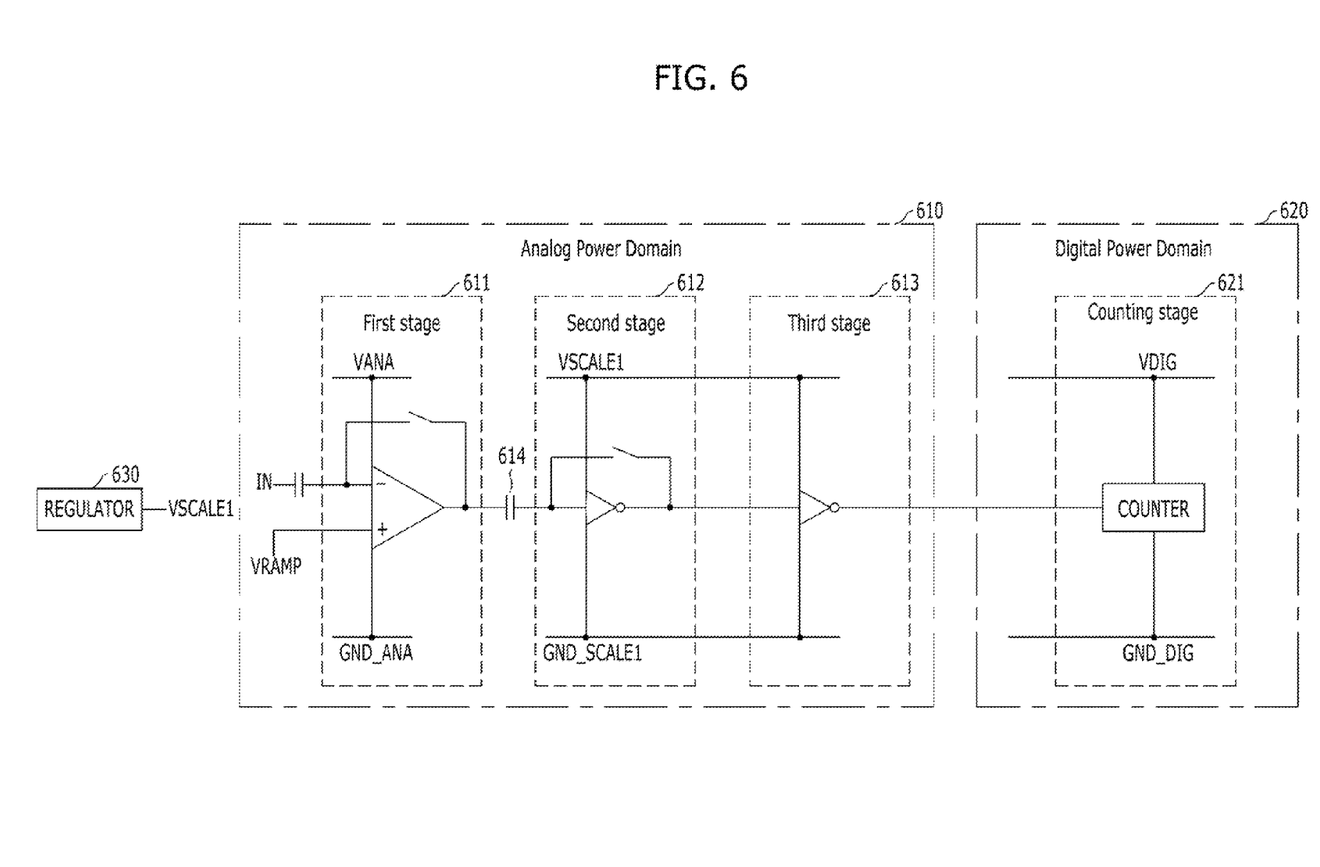
FIG. 6 is a circuit diagram illustrating an integrated circuit in accordance with an embodiment of the present invention.

FIG. 6 is a circuit diagram illustrating an integrated circuit in accordance with an embodiment of the present invention.

Referring to FIG. 6, the basic framework of the integrated circuit, including, for example, the unit ADC, in accordance with this embodiment of the present invention is substantially the same as what is shown in FIG. 4, but the power domain structures are different.

The integrated circuit scales a voltage by having the second stage 612 and the third stage 613 belong to the same power domain because a capacitor 614 block a direct current (DC) voltage.

To be more specific, the integrated circuit illustrated in FIG. 6 includes an analog power domain 610, a digital power domain 620, and a regulator 630. The analog power domain 610 includes a first stage 611 operating by using the first voltage VANA, a second stage 612 operating by using a scaled voltage VSCALE1, and a third stage 613 operating by using the same scaled voltage VSCALE1 that the second stage 612 operates. The digital power domain 620 includes a counting stage 621 that operates by using a second voltage VDIG. The regulator 630 reduces a voltage level difference between the analog power domain 610 and the digital power domain 620 by down-scaling a voltage into the scaled voltage VSCALE1 and supplying the scaled voltage VSCALE1 to the second stage 612 and the third stage 613 of the analog power domain 610. Hereinafter, the second and third stages 612 and 613 operating by using the scaled voltage VSCALE1 may be referred to as a scaled power domain circuit or a scaled-down power domain circuit. Since the other details are the same as what is described with reference to FIG. 4, they are not described herein.

Figure 7:
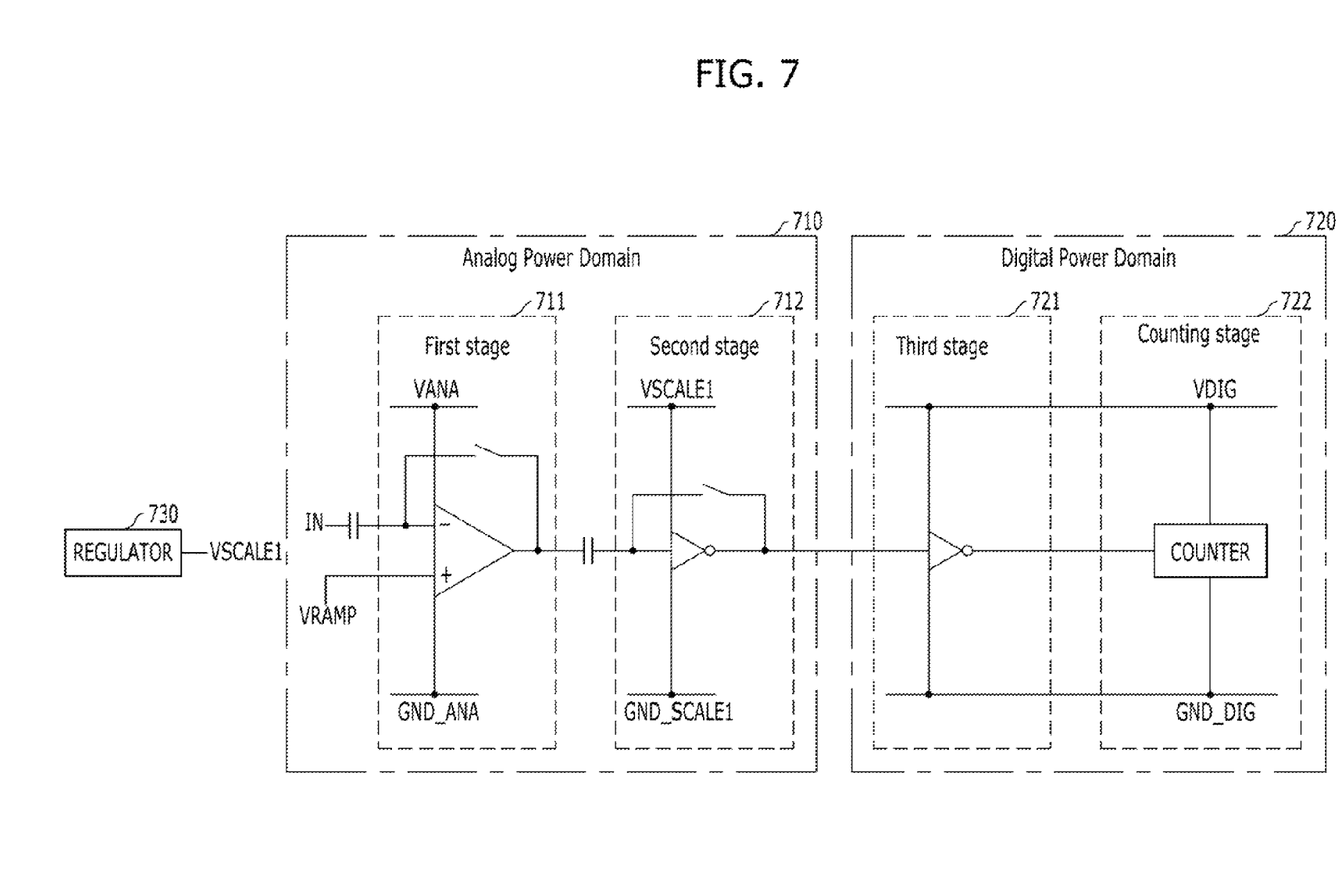
FIG. 7 is a circuit diagram illustrating an integrated circuit in accordance with an embodiment of the present invention.

FIG. 7 is a circuit diagram illustrating an integrated circuit in accordance with an embodiment of the present invention.

Referring to FIG. 7, the basic framework of the integrated circuit, including, for example, the unit ADC, in accordance with embodiment of the present invention is substantially the same as what is shown in FIGS. 4 and 6, but the power domain structures are different.

In the integrated circuit, a voltage is down-scaled, and the down-scaled voltage is supplied to a second stage 712. Also, a third stage 713 is sent to a digital power domain 720 and operates by using the second voltage VDIG.

To be more specific, the integrated circuit illustrated in FIG. 7 includes an analog power domain 710, a digital power domain 720, and a regulator 730. The analog power domain 710 includes a first stage 711 operating by using the first voltage VANA and a second stage 712 operating by using a scaled voltage VSCALE1. The digital power domain 720 includes a third stage 721 operating by using the second voltage VDIG and a counting stage 722 that also operates by using the second voltage VDIG. The regulator 730 reduces a voltage level difference between the analog power domain 710 and the digital power domain 720 by down-scaling a voltage into the scaled voltage VSCALE1 and supplying the scaled voltage VSCALE1 to the second stage 712 of the analog power domain 710. Hereinafter, the second stage 712 operating by using the scaled voltage VSCALE1 may be referred to as a scaled power domain circuit or a scaled-down power domain circuit. Since the other details are the same as what is described with reference to FIG. 4, they are not described herein.

Figure 8:
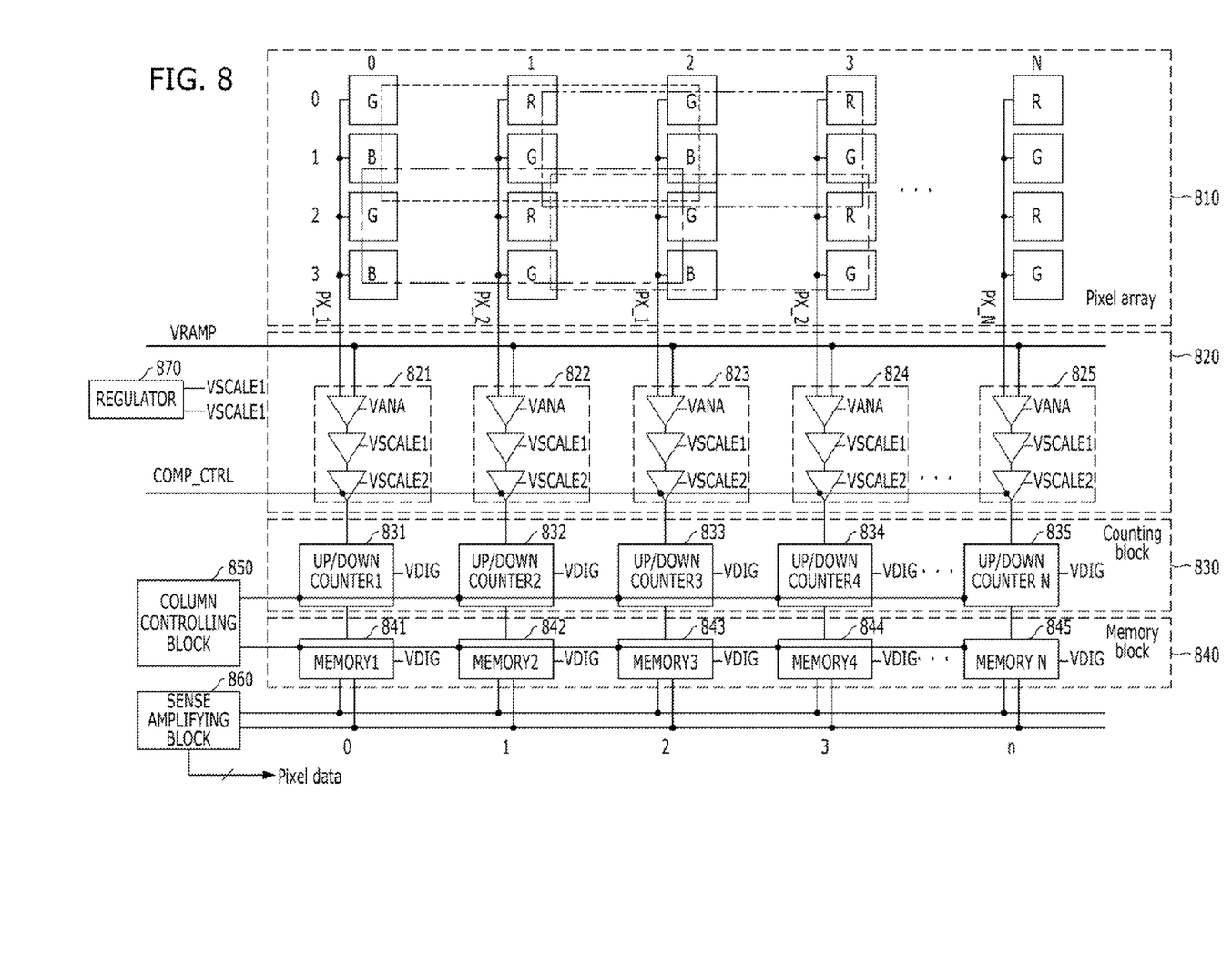
FIG. 8 is a block diagram illustrating a CMOS image sensor with a plurality of ADCs in accordance with an embodiment of the present invention.

FIG. 8 is a block diagram illustrating a CMOS image sensor with a plurality of ADCs in accordance with an embodiment of the present invention. In the embodiment, a regulator 870 down-scales a voltage and independently supplies the down-scaled voltage to each stage of comparators 821 to 825.

Referring to FIG. 8, the a CMOS image sensor includes a pixel array 810, a regulator 870, a comparison block 820, a counting block 830, a buffer memory block 840, a column controlling block 850, and a sense amplifying block 860.

The pixel array 810 outputs pixel signals corresponding to incident light. The regulator 870 reduces the voltage level difference between an analog power domain and a digital power domain by scaling a voltage and supplying the scaled voltage to each stage of the analog power domain. The comparison block 820 operates by using the first voltage VANA and the scaled voltages VSCALE1 and VSCALE2 that are applied from the regulator 870, and compares the values of the pixel signals outputted from the pixel array 810 with the value of a ramp signal VRAMP that is transferred from an external voltage generator (not shown) based on a comparator control signal COMP_CTRL that is transferred from an external CIS controller (not shown). The counting block 830 operates by using the second voltage VDIG and performs counting operations based on the output of the comparison block 820. The buffer memory block 840 operates by using the second voltage VDIG and stores count information that is outputted from the counting block 830. The column controlling block 850 controls the operations of the counting block 830 and the buffer memory block 840. The sense amplifying block 860 reads the data stored in the buffer memory block 840 and outputs digital pixel data. Herein, the analog-digital converter in accordance with the embodiment of the present invention includes the regulator 870, the comparison block 820, and the counting block 830, and the others, which includes the pixel array 810, the buffer memory block 840, the column controlling block 850, and the sense amplifying block 860 belong to the CMOS image sensor.

The comparison block 820 includes a plurality of comparators 821 to 825, and the counting block 838 includes a plurality of up/down counters 831 to 835. The buffer memory block 840 includes a plurality of buffer memories 841 to 845. Hereafter, each comparator and each up/down counter have the power domain structures as described with reference to FIG. 4, 6 or 7. Since the details are as described above, further descriptions are not provided herein.

According to an embodiment of the present invention, gain margin in the operation region may be secured by scaling a voltage for each stage, and as a result, amplification gain may be maximized.

Also, according to an embodiment of the present invention, the maximized amplification gain may prevent the resolution of comparators from deteriorating.

As digital logic process for a CMOS image sensor develops, an analog power domain is changed into a digital power domain, and the voltage of the analog power domain and the voltage of the digital power domain are different. To alleviate the concern of voltage level difference and to alleviate the offset and deterioration in gain that occur from the voltage level difference, an embodiment of the present invention provides a technology of down-scaling a voltage for the latter part of the stages in the analog power domain.

Also, the power noise, which is a concern caused by an inverter-type amplifier, may be relieved through voltage distribution.

While the present invention has been described with respect to the specific embodiments, it will be apparent to those skilled in the art that various changes and modifications may be made without departing from the spirit and scope of the invention as defined in the following claims.

What is claimed is:

1. An integrated circuit comprising:
   an analog power domain circuit having more than one stages;
   a digital power domain circuit having at least one stage receiving an output signal of the analog power domain circuit; and
   a voltage regulating unit suitable for supplying at least one scaled power to the latter part of the stages of the analog power domain circuit to reduce a voltage level difference between the analog power domain circuit and the digital power domain circuit.

2. The integrated circuit of claim 1, wherein the voltage regulating unit includes a low-dropout regulator suitable for generating the scaled power.

3. The integrated circuit of claim 1, wherein the analog power domain circuit includes:
   a first stage operating by using an analog power; and
   a second stage suitable for receiving an output of the first stage and operating by using a first scaled power, which has a voltage level that is lower than a voltage level of the analog power.

4. The integrated circuit of claim 3, wherein the digital power domain circuit includes:
   a third stage suitable for receiving an output of the second stage and operating by using an digital power; and
   a fourth stage suitable for receiving an output of the third stage and operating by using the digital power, which has a voltage level that is lower than a voltage level of the first scaled power.

5. The integrated circuit of claim 1, wherein the analog power domain circuit includes:

a first stage operating by using an analog power;
a second stage suitable for receiving an output of the first stage and operating by using a first scaled power, which has a voltage level that is lower than a voltage level of the analog power; and
a third stage suitable for receiving an output of the second stage and operating by using the first scaled power.

6. The integrated circuit of claim 1, wherein the analog power domain circuit includes:
a first stage operating by using an analog power;
a second stage suitable for receiving an output of the first stage and operating by using a first scaled power, which has a voltage level that is lower than a voltage level of the analog power; and
a third stage suitable for receiving an output of the second stage and operating by using a second scaled power, which has a voltage level that is lower than a voltage level of the first scaled power.

7. An analog-digital converter comprising:
a voltage scaling unit suitable for scaling a voltage for each stage of an analog power domain circuit to produce a scaled voltage and to supply the scaled voltage to the stage of the analog power domain circuit to reduce a voltage level difference between the analog power domain circuit and a digital power domain circuit;
a comparison block suitable for comparing a value of a pixel signal with a value of a ramp signal based on a comparator control signal to produce a comparison result; and
a counting block suitable for performing a counting operation based on the comparison result of the comparison block by using a digital voltage,
wherein the comparison block is operated by supplying an analog voltage or the scaled voltage obtained in the voltage scaling unit.

8. The analog-digital converter of claim 7, wherein the voltage scaling unit includes a low-dropout regulator suitable for generating the scaled voltage.

9. A CMOS image sensor comprising:
a pixel array suitable for outputting pixel signals corresponding to incident light;
a voltage scaling unit suitable for scaling a voltage for each stage of an analog power domain circuit to produce a scaled voltage and for supplying the scaled voltage to the stage of the analog power domain circuit to reduce a voltage level difference between the analog power domain circuit and a digital power domain circuit;
a comparison block suitable for comparing values of the pixel signals with a value of a ramp signal based on a comparator control signal to produce a comparison result;
a counting block suitable for performing a counting operation based on the comparison result of the comparison block by using a digital voltage;
a buffer memory block suitable for operating by using the digital voltage and for storing count information obtained in the counting block;
a column controlling block suitable for controlling operations of the counting block and the buffer memory block; and
a sense amplifying block suitable for reading data stored in the buffer memory block and for outputting digital pixel data,
wherein the comparison block is operated by supplying an analog voltage or the scaled voltage obtained in the voltage scaling unit.

10. The CMOS image sensor of claim 9, wherein the voltage regulating unit includes a low-dropout regulator suitable for generating the scaled voltage.

11. An integrated circuit comprising:
an analog power domain circuit operating by using an analog power;
a digital power domain circuit operating by using a digital power; and
a scaled-down power domain circuit, which is disposed between the analog power domain circuit and the digital power domain circuit, operating by using at least one scaled-down power,
wherein the scaled-down power has a voltage level higher than a voltage level of the digital power and lower than a voltage level of the analog power.

12. The integrated circuit of claim 11, wherein the scaled-down power domain circuit includes:
a first stage suitable for receiving an output of the analog power domain circuit and operating by using a first scaled power.

13. The integrated circuit of claim 12, wherein the digital power domain circuit includes:
a counter stage suitable for receiving an output of the scaled-down power domain circuit and operating by using the digital power.

14. The integrated circuit of claim 11, wherein the scaled-down power domain circuit includes:
a first stage suitable for receiving an output of the analog power domain circuit and operating by using a first scaled power; and
a second stage suitable for receiving an output of the first stage and operating by using a second scaled power, which has a voltage level that is lower than a voltage level of the first scaled power.

15. The integrated circuit of claim 11, wherein the scaled-down power domain circuit includes:
a first stage suitable for receiving an output of the analog power domain circuit and operating by using a first scaled power; and
a second stage suitable for receiving an output of the first stage and operating by using the first scaled power.

16. The integrated circuit of claim 11, wherein the analog power domain circuit includes:
a comparator stage suitable for comparing voltage levels of the pixel signals with a voltage level of a ramp signal by using the analog power.

17. A CMOS image sensor comprising:
a pixel array suitable for outputting pixel signals corresponding to incident light;
a comparison block suitable for comparing voltage levels of the pixel signals with a voltage level of a ramp signal by using a first power, and for outputting a comparison result by using a second power, which has a voltage level that is lower than a voltage level of first power; and
a counting block suitable for performing a counting operation based on the comparison results by using a third power, which has a voltage level that is lower than a voltage level of second power.

18. The CMOS image sensor of claim 17, further comprising a voltage regulating unit suitable for generating the second power by scaling-down the first power.

19. The CMOS image sensor of claim 17, further comprising:
a buffer memory block suitable for operating by using the third power and for storing count information obtained in the counting block;

a sense amplifying block suitable for reading data stored in the buffer memory block and for outputting digital pixel data; and a column controlling block suitable for controlling operations of the counting block and the buffer memory block.

* * * * *